United States Patent [19]

Botzenhardt

[11] 3,893,160

[45] July 1, 1975

[54] RESISTIVE CONNECTING CONTACT FOR A SILICON SEMICONDUCTOR COMPONENT

[75] Inventor: Leonhard Botzenhardt, Heilbronn, Germany

[73] Assignee: Licentia-Patent-Verwaltungs-G.m.b.H., Frankfurt am Main, Germany

[22] Filed: Aug. 28, 1973

[21] Appl. No.: 392,174

[30] Foreign Application Priority Data

Sept. 8, 1972 Germany ............................ 2244062

[52] U.S. Cl. ........................ 357/71; 357/65; 357/67

[51] Int. Cl. .............................. H01l 3/00; H01l 5/00

[58] Field of Search .......... 317/234, 5, 5.2, 5.3, 5.4, 317/235, 31

[56] References Cited

UNITED STATES PATENTS

| | | | |
|---|---|---|---|
| 3,449,825 | 6/1969 | Loro | 317/234 L |
| 3,667,005 | 5/1972 | Cunningham et al. | 317/234 L |
| 3,686,080 | 8/1972 | Banfield et al. | 317/234 M |

*Primary Examiner*—Andrew J. James
*Attorney, Agent, or Firm*—Spencer & Kaye

[57] ABSTRACT

A resistive connecting contact for a silicon semiconductor component comprises, on the semiconductor body, a layer sequence platinum silicide-titanium-molybdenum-gold. The invention also includes a method of making such a connecting contact.

5 Claims, 1 Drawing Figure

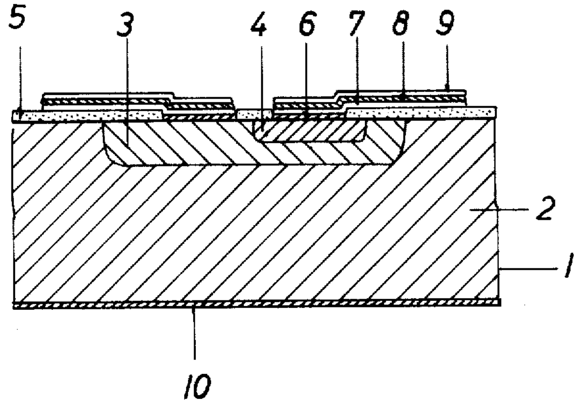

RESISTIVE CONNECTING CONTACT FOR A SILICON SEMICONDUCTOR COMPONENT

BACKGROUND OF THE INVENTION

The invention relates to a resistive connecting contact for a silicon semiconductor component. This contact should be particularly suitable for high-frequency transistors, in which the emitter regions have only a small penetration depth in the semiconductor body.

Hitherto high-frequency planar transistors and other semiconductor components were preferably provided with aluminium contacts. However, it has been shown that such components can be subjected to increased temperatures only to a limited extent, since the components are obviously destroyed by reaction between the aluminium and the silicon or the silicon dioxide. Particularly in the case of increased temperatures, a considerable increase in the residual currents can be observed.

It has been shown, for example, in temperature tests, that the component contacted with aluminium has up to a 30% failure rate at temperatures of 400°C. In many cases an admissable storage temperature of 200°C is specified for high-frequency transistors. It has also been shown that components contacted with aluminium do not satisfy these requirements in the long term.

SUMMARY OF THE INVENTION

It is an object of the present invention to provide a resistive contact connection which resists high temperature loads.

According to a first aspect of the invention, there is provided a resistive connecting contact for a silicon semiconductor component, characterized in that the contact, starting from the silicon semiconductor body, comprises the layer sequence platinum silicide-titanium-molybdenum-gold.

According to a second aspect of the invention, there is provided a method of producing a connecting contact for a silicon semiconductor component comprising the steps of first depositing a thin platinum layer by evaporation on the semiconductor body and thereafter tempering the semiconductor component in an inert gas atmosphere to form the platinum silicide.

BRIEF DESCRIPTION OF THE DRAWING

The invention will now be described in greater detail, by way of example, with reference to the drawing, the single FIGURE of which shows a sectional view of a semiconductor component in the form of a transistor with base and emitter contacts in accordance with the invention.

DESCRIPTION OF THE PREFERRED EMBODIMENT

Basically, the invention proposes that the contact comprises, starting from the silicon semiconductor body, the layer sequence platinum silicide-titanium-molybdenum-gold.

In temperature tests it has been shown that the components contacted in accordance with the invention can resist even a temperature of 600°C. These components also endure for a long time temperature of 200°C without damage. Now also higher soldering temperatures can be used to secure the semiconductor components to a carrier body. In this case the cycle time of the soldering machine can be increased thereby. Further an additional rear side metallization of the semiconductor wafers can be dispensed with. In the case of the now possible soldering temperature, semiconductor bodies can be soldered directly on to a gold-coated carrier body.

The layer sequence in accordance with the invention for the resistive connection contact is preferably produced as follows:

The silicon dioxide layer covering a semiconductor body of silicon is provided with windows at the places provided in the positions present in the semiconductor body for the connecting contact. This is effected by the known masking and etching technology. Thereafter a thin platinum layer is deposited by evaporation on to the thus prepared surface. This platinum layer, which is approximately 5 nm thick, can be deposited for example by evaporation with the help of electron beam equipment. After this, the semiconductor arrangement is heat treated in an inert gas atmosphere to form the platinum silicide. The tempering is effected, for example, at a temperature of approximately 500°C in a nitrogen atmosphere. The platinum in this case reacts only with the monocrystalline silicon material, whereas no reaction with the oxide takes place.

After heat treatment, the semiconductor arrangements are etched in hot aqua regia. In this case the pure platinum is removed from the oxide, whereas the platinum silicide is not attacked.

After this, layers of titanium, molybdenum and gold are applied in a vacuum plant one after the other without intermediate ventilation of the plant. The molybdenum layer in this case is sputtered on. The best sputtered-on molybdenum layers are achieved with a triode sputter plant at an oven pressure of approximately $3.10^{-4}$Torr. Titanium and gold are either sputtered-on or deposited by evaporation. For example the titanium layer is first deposited by evaporation at approximately 200°C from a tungsten coil. The thickness of the layer is about 10 nm.

The molybdenum layer is likewise sputtered on at about 200°C. Its thickness is approximately 0.3 μm. A direct current sputter plant or a high-frequency sputter plant can be used to produce this layer.

Subsequently a gold layer with a thickness of approximately 0.6 μm is deposited by evaporation at 200°C.

For the structuring of the three layers applied last, which first of all cover the whole semiconductor surface, the known masking and etching technology is again used. For example gold is dissolved at the required positions in a complex-forming iodine etching solution. A mixture of nitric acid, sulphuric acid and acetic acid are used to etch the molybdenum. Titanium is etched with diluted hydrofluoric acid.

Referring now to the drawing, there is shown a transistor with contacts in accordance with the invention to the base and to the emitter region. The semiconductor body 1 comprises a monocrystalline silicon and has a collector region 2, a base region 3 and an emitter region 4. The surface side of the planar transistor common to all regions is covered with a silicon dioxide layer 5. A window was made over the base region and the emitter region. The lowest layer 6 of the contact comprises platinum silicide, the layer 7 comprises titanium, 8 is the molybdenum and 9 is the gold layer. The three last-named layers extend on the oxide layer 5 and there form a large area connecting contact. The rear side contact for the collector is given the reference numeral 10.

The new contact system is suitable above all for high-frequency transistors. However, it can also be transferred to most other silicon semiconductor components.

It will be understood that the above description of the present invention is susceptible to various modification changes and adaptations.

What is claimed is:

1. A resistive connecting contact for a silicon semiconductor component, characterized in that the contact, starting from the silicon semiconductor body, comprises the layer sequence platinum silicide-titanium-molybdenum-gold.

2. A connecting contact as defined in claim 1, wherein said titanium layer is approximately 10 nm thick.

3. A connecting contact as defined in claim 2, wherein said molybdenum layer is approximately 0.3 $\mu m$ thick.

4. A connecting contact as defined in claim 3, wherein said gold layer is approximately 0.6 $\mu m$.

5. A semiconductor component comprising a semiconductor body, a plurality of regions extending from one surface of said semiconductor body, an insulating layer on said one surface and a resistive connecting contact comprising a layer sequence platinum silicide-titanium-molybdenum-gold provided on at least one of said plurality of regions.

* * * * *